(12) United States Patent
Trivedi et al.

(10) Patent No.: US 6,861,885 B2
(45) Date of Patent: Mar. 1, 2005

(54) PHASE LOCKED LOOP DESIGN WITH DIODE FOR LOOP FILTER CAPACITANCE LEAKAGE CURRENT CONTROL

(75) Inventors: Pradeep Trivedi, Sunnyvale, CA (US); Sudhakar Bobba, Sunnyvale, CA (US); Claude Gauthier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 32 days.

(21) Appl. No.: 10/199,426

(22) Filed: Jul. 19, 2002

(65) Prior Publication Data

US 2004/0012421 A1 Jan. 22, 2004

(51) Int. Cl.[7] .................................................. H03L 7/06
(52) U.S. Cl. .................. 327/156; 327/147; 327/538; 375/376; 331/DIG. 2
(58) Field of Search .................................... 327/146, 147, 327/148, 155–157, 158, 161, 162, 551–555, 558, 333, 538–543; 331/1 A, DIG. 2; 375/373–376

(56) References Cited

U.S. PATENT DOCUMENTS

| | | | |
|---|---|---|---|
| 2,912,651 A | * 11/1959 | Leeds | 331/17 |
| 5,334,952 A | 8/1994 | Maddy et al. | 331/1 A |
| 5,523,724 A | 6/1996 | Assar et al. | 331/1 A |
| 5,548,829 A | * 8/1996 | Suzuki et al. | 455/180.3 |
| 5,559,474 A | * 9/1996 | Matsumoto et al. | 331/17 |
| 5,659,588 A | * 8/1997 | Fiedler | 375/376 |
| 5,717,353 A | * 2/1998 | Fujimoto | 327/276 |
| 6,437,615 B1 | * 8/2002 | Stascausky | 327/156 |

OTHER PUBLICATIONS

John G. Maneatis, "Low–Jitter Process–Independent DLL and PLL Based on Self–Biased Techniques", IEEE Journal of Solid State Circuits, vol. 31, No. 11, Nov. 1996, pp. 1723–1732.

* cited by examiner

*Primary Examiner*—Minh Nguyen
(74) *Attorney, Agent, or Firm*—Osha & May L.L.P.

(57) ABSTRACT

A phase locked loop design uses a diode operatively connected to a loop filter capacitor to control a leakage current of the loop filter capacitor. By positioning a diode in series with the loop filter capacitor, a voltage potential across the loop filter capacitor is reduced, thereby reducing the leakage current of the loop filter capacitor. Moreover, the leakage current of the loop filter capacitor is controlled in that it cannot exceed the current through the diode. Control and reduction of the loop filter capacitor leakage current leads to more reliable and stable phase locked loop behavior.

13 Claims, 5 Drawing Sheets

PHASE LOCKED LOOP DESIGN WITH DIODE FOR LOOP FILTER CAPACITANCE LEAKAGE CURRENT CONTROL

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as sys_clk) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal (shown in FIG. 1 as chip_clk) to the microprocessor 12. The system clock and chip clock have a specific phase and frequency relationship that is controlled and maintained by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 may become non-deterministic.

FIG. 2 shows a diagram of a typical PLL 30. The PLL 30 uses a phase frequency detector 36 that operatively receives an input clock signal, clk_in 32, and a feedback clock signal, fbk_clk 34. The phase frequency detector 36 compares the phases of the input clock signal 32 and the feedback clock signal 34, and dependent on the comparison, the phase frequency detector 36 outputs pulses on UP 38 and DOWN 40 signals to a charge pump 42. Depending on the pulses on the UP 38 and DOWN 40 signals, the charge pump 42 transfers charge to or from a loop filter capacitor 46 via a control voltage signal, Vctrl 45. Those skilled in the art will understand that the loop filter capacitor 46 along with a loop filter resistor 44 form a 'loop filter' of the PLL 30.

The control voltage signal 45 serves as an input to a bias generator 50, which, in turn, outputs at least one bias signal 51 to a voltage-controlled oscillator 52. The voltage-controlled oscillator (VCO) 52, dependent on the at least one bias signal 51, outputs a clock signal, clk_out 60, that (1) propagates through a clock distribution network 54 (modeled in FIG. 2 as buffers 56 and 58) and (2) serves as an output of the PLL 30. The output clock signal 60 is fed back through a feedback divider 62, which, in turn, outputs to a buffer 64 that generates the feedback clock signal 34 to the phase frequency detector 36. For a more detailed background on the operation and behavior of a PLL, see J. Maneatis, "Low-Jitter Process-Independent DLL and PLL Based on Self-Biased Techniques," IEEE Journal of Solid-State Circuits, vol. 31, no. 11, November 1996.

SUMMARY OF INVENTION

According to one aspect of the present invention, an integrated circuit comprises a phase frequency detector arranged to detect a phase difference between a first clock signal and a second clock signal, a charge pump arranged to output a control voltage signal dependent on the phase difference, a capacitor operatively connected to the control voltage signal, a diode operatively connected to the capacitor, and a voltage-controlled oscillator arranged to output the second clock signal dependent on the control voltage signal.

According to another aspect, an integrated circuit comprises means for detecting a phase difference between a first clock signal and a second clock signal, means for generating a signal dependent on the phase difference, means for storing charge to maintain a voltage potential on the signal, a diode arranged to control a leakage current of the means for storing charge, and means for generating the second clock signal dependent on the signal.

According to another aspect, a method for performing a phase locked loop operation comprises comparing a phase difference between a first clock signal and a second clock signal, generating a control voltage signal dependent on the comparing, storing charge dependent on the control voltage signal using a capacitor, controlling a leakage current of the capacitor with a diode positioned in series with the capacitor, and generating the second clock signal dependent on the control voltage signal.

Other aspects and advantages of the invention will be apparent from the following description and the appended claims.

DETAILED DESCRIPTION

As device features, such as transistor features, used to implement integrated circuit components, e.g., PLLs, continue to get smaller, they may have higher leakage currents (i.e., higher gate tunneling currents). This is due to the fact that as transistor features are designed smaller, the thickness of the transistor's oxide layer (located between the transistor's gate and the semiconductor substrate) is reduced. As the oxide layer is reduced to a few angstroms, the transistor's gate terminal begins to leak charge to the other terminals of the transistor. In the case of a PLL's loop filter capacitor, which is typically desired to be large from a capacitance perspective and that can be implemented with a transistor, such reduction in transistor size features and consequential increase in leakage current can adversely affect the behavior of the PLL. In some cases, particular amounts of leakage current through the PLL's loop filter capacitor can even cause the PLL to malfunction. Accordingly, there is a need for a PLL design that guards against or compensates for a PLL loop filter capacitor's leakage current.

Figure 1:
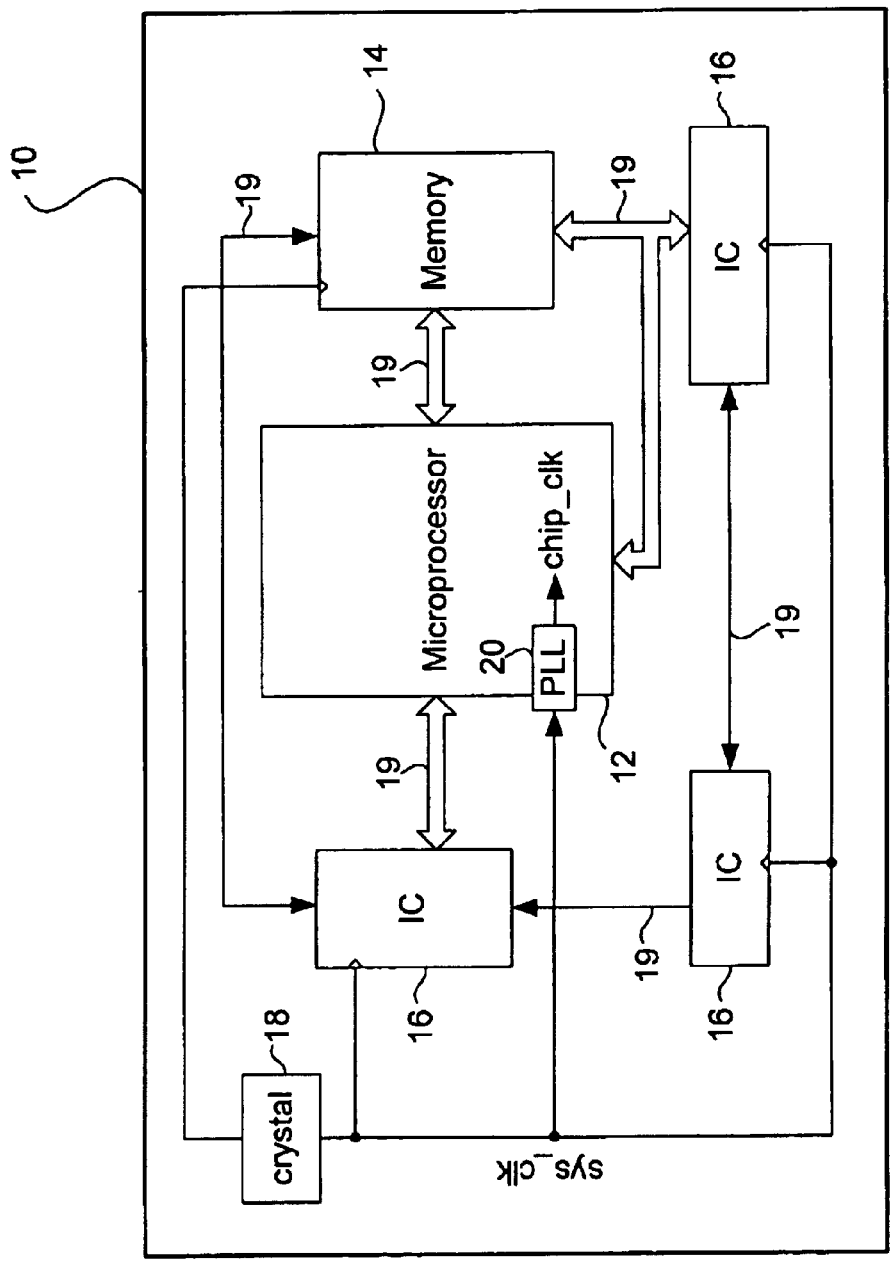
FIG. 1 shows a typical computer system.
Figure 2:
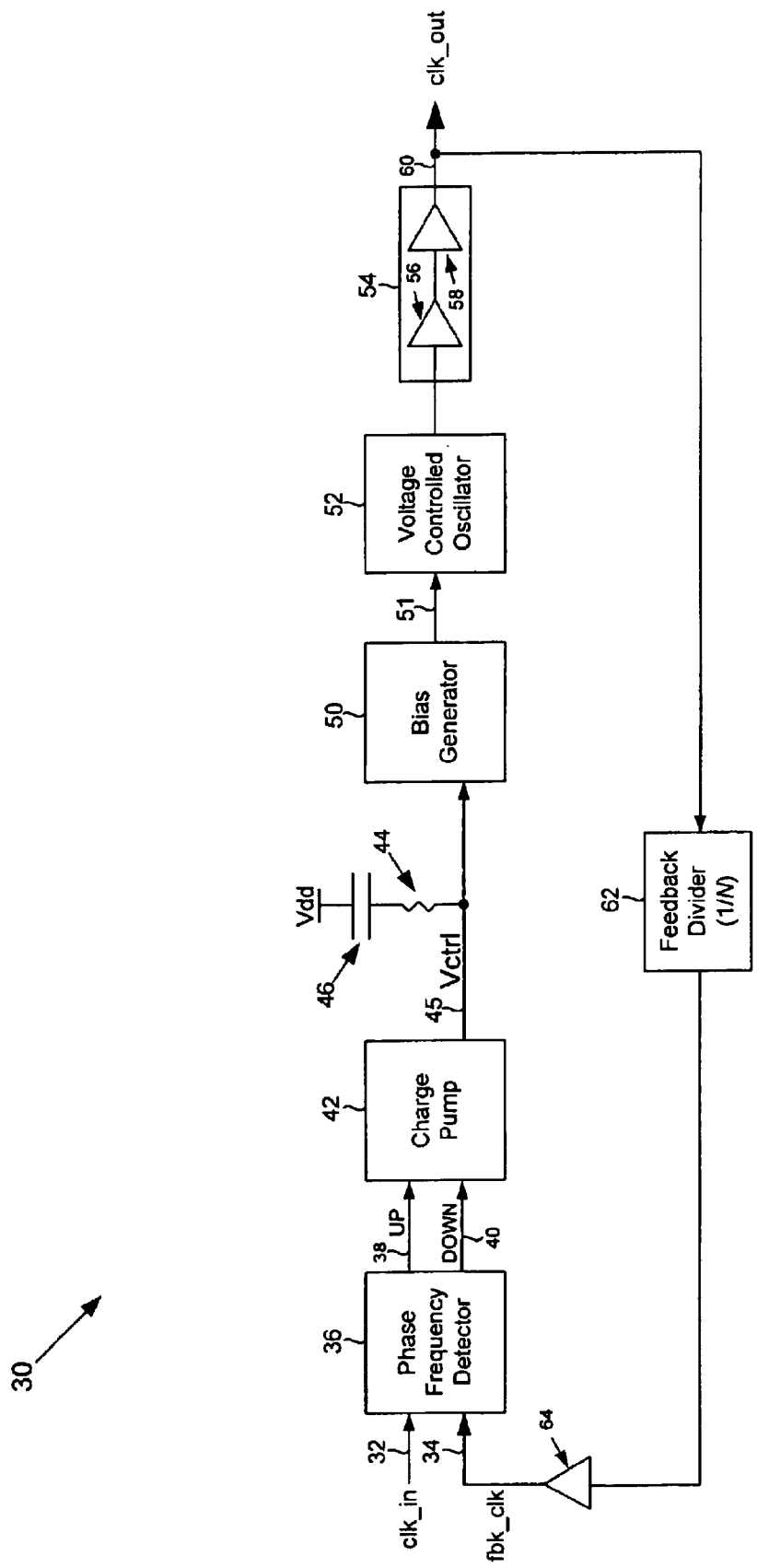
FIG. 2 shows a typical PLL.
Figure 3:
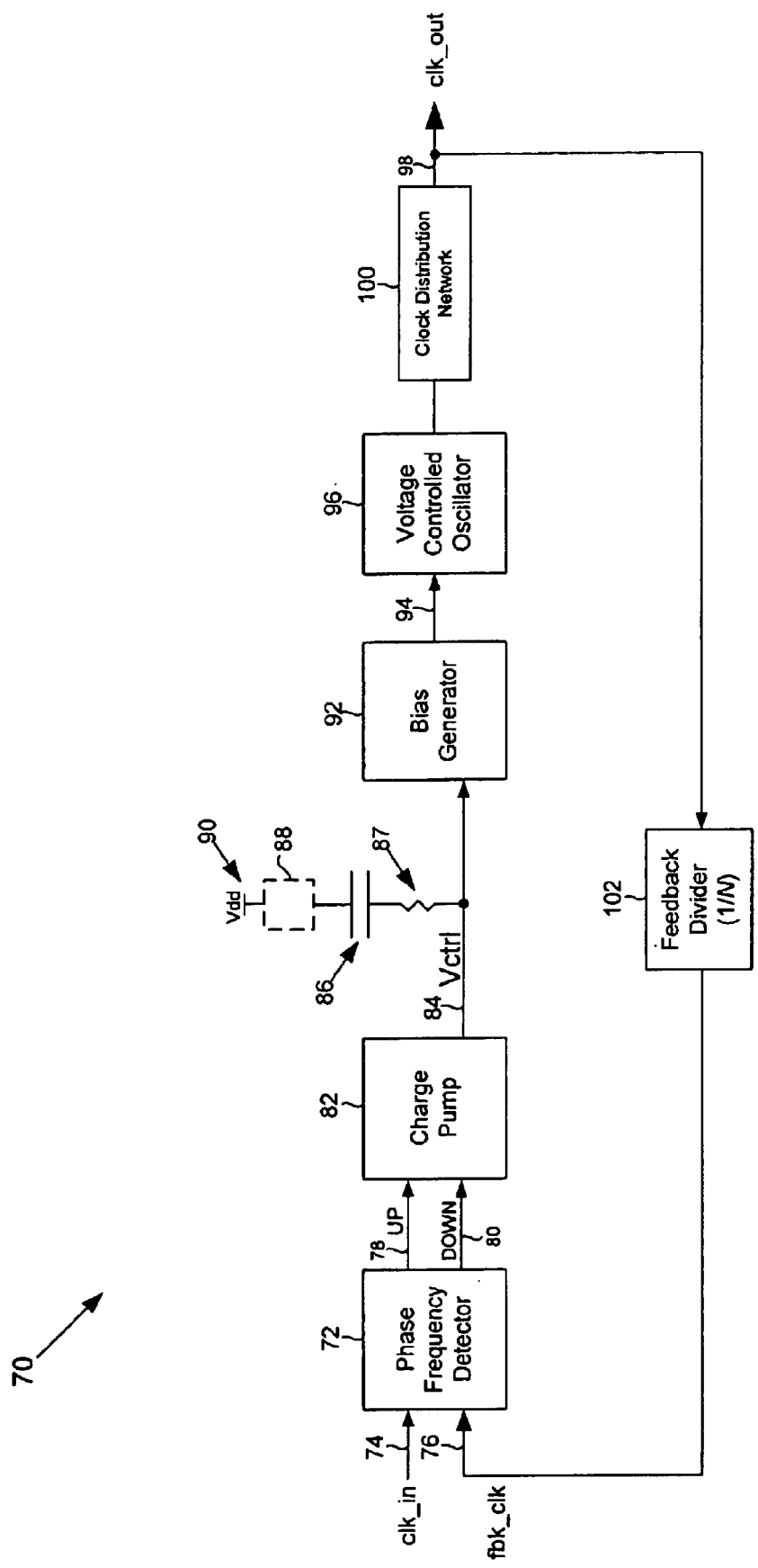
FIG. 3 shows a PLL in accordance with an embodiment of the present invention.

FIG. 3 shows a PLL 70 in accordance with an embodiment of the present invention. The PLL 70 uses a phase frequency detector 72 that detects a phase difference between an input clock signal, clk_in 74, and a feedback clock signal, fbk_clk 76. Dependent on the phase difference detected by the phase frequency detector 72, the phase frequency detector 72 outputs pulses on UP 78 and DOWN 80 signals to a charge pump 82. The charge pump 82, dependent on the pulses on the UP 78 and DOWN 80 signals, generates a control voltage signal, Vctrl 84.

For stability, the PLL 70 uses a loop filter, formed by a loop filter capacitor 86 and a loop filter resistor 87, that is operatively connected to the control voltage signal 84. The loop filter capacitor 86 stores/dissipates charge dependent on the control voltage signal 84. Those skilled in the art will understand that the loop filter capacitor 86 may be implemented using the gate capacitance of a metal-oxide semiconductor field-effect transistor (MOSFET). The UP 78 and DOWN 80 signals are pulsed only once per clock cycle, and therefore, the control voltage signal 84 may not be maintained due to the leakage current of the loop filter capacitor 86. To guard against increased leakage currents associated with smaller transistor features, a first terminal of a diode 88 is connected to the loop filter capacitor 86. In other words, the diode 88 is positioned in series with the loop filter capacitor 86. A second terminal of the diode 88 is connected to a voltage potential Vdd 90. Those skilled in the art will note, that in one or more other embodiments, the second terminal of the diode 88 may be connected to a voltage potential Vss (not shown) instead of the voltage potential Vdd 90.

By connecting the diode 88 in series with the loop filter capacitor 86, the voltage potential across the loop filter capacitor 86 is reduced relative to the case in which there is no diode and the loop filter is connected across the control voltage signal 84 and the voltage potential Vdd 90. Accordingly, by reducing the voltage potential across the loop filter capacitor 86, the leakage current of the loop filter capacitor 86 is reduced, which, in turn, promotes stable and reliable PLL 70 operation. Moreover, those skilled in the art will understand that the diode 88 should have a maximum leakage current less than that of the loop filter capacitor 86. The implementation of the diode 88 is further described below with reference to FIGS. 4 and 5.

Referring to FIG. 3, the control voltage signal 84 serves as an input to a bias generator 92 that produces at least one bias signal 94 to a voltage-controlled oscillator (VCO) 96. The voltage-controlled oscillator 96, dependent on the at least one bias signal 94 from the bias generator 92, generates an output clock signal, clk_out 98. The output clock signal 98, in addition to serving as an output of the PLL 70, is fed back to an input of the phase frequency detector 72 through a clock distribution network 100 and a feedback divider 102. Those skilled in the art will note that, in one or more other embodiments, the PLL 70 may be implemented without the bias generator 92 by operatively connecting the voltage-controlled oscillator 96 with the control voltage signal 84.

Figure 4:
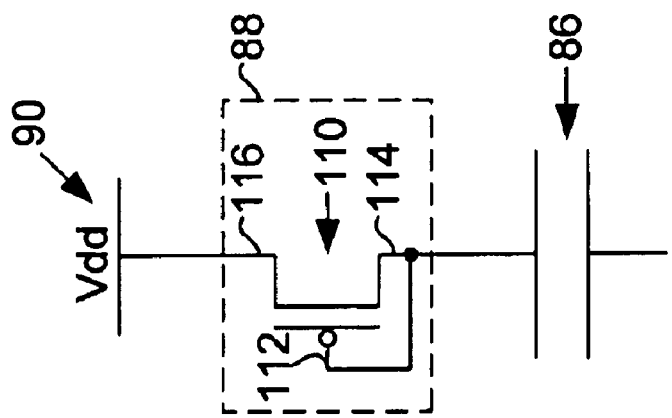
FIG. 4 shows a portion of the PLL shown in FIG. 3 in accordance with an embodiment of the present invention.

FIG. 4 shows an implementation of the diode 88 shown in FIG. 3 in accordance with an embodiment of the present invention. In FIG. 4, the diode 88 is implemented with a p-channel transistor 110 that has its gate terminal 112 connected to its drain terminal 114. The p-channel transistor's 110 source terminal 116 is connected to the voltage potential Vdd 90. Accordingly, the p-channel transistor 110 is said to be "diode-connected."

Due to this configuration, the leakage current of the loop filter capacitor 86 is controlled because it cannot get larger than the source to drain current of the diode-connected p-channel transistor 110. Moreover, due to the voltage drop across the diode-connected p-channel transistor 110, the voltage potential across the loop filter capacitor 86 is reduced, which, in turn, reduces the leakage current of the loop filter capacitor 86.

Those skilled in the art will note that, in one or more other embodiments, a diode-connected transistor positioned in series with a PLL loop filter capacitor maybe connected to a voltage potential Vss (i.e., a ground potential), in which case, the diode-connected transistor could be implemented with an n-channel transistor.

Figure 5:
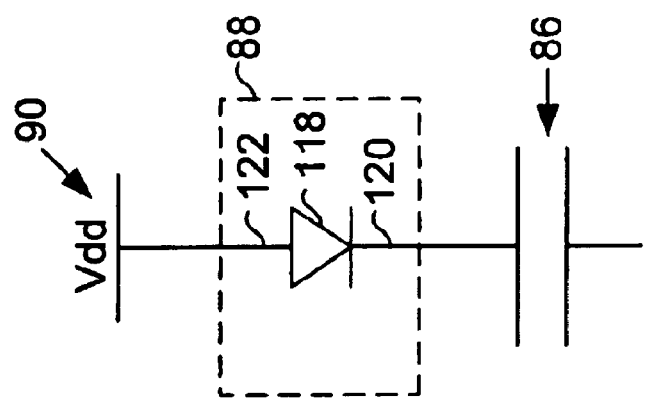
FIG. 5 shows a portion of the PLL shown in FIG. 3 in accordance with an embodiment of the present invention.

FIG. 5 shows an implementation of the diode 88 shown in FIG. 3 in accordance with an embodiment of the present invention. In FIG. 5, the diode 88 is implemented with a p-n junction diode 118 that has its cathode terminal 120 connected to the loop filter capacitor 86 and its anode terminal 122 connected to the voltage potential Vdd 90.

Due to this configuration, the leakage current of the loop filter capacitor 86 is controlled because it cannot get larger than the, current through the p-n junction diode 118. Moreover, due to the voltage drop across the p-n junction diode 118, the voltage potential across the loop filter capacitor 86 is reduced, which, in turn, reduces the leakage current of the loop filter capacitor 86.

Those skilled in the art will note that, in one or more other embodiments, a p-n junction diode positioned in series with a PLL loop filter capacitor may be connected to a voltage potential Vss (i.e., a ground potential), in which case, the p-n junction diode would have its anode terminal connected to the PLL loop filter capacitor and its cathode terminal connected to the voltage potential Vss.

Those skilled in the art will further note that p-n junction devices that may be positioned in series with the loop filter capacitor 86 include, among other types, rectifier diodes, Schottky diodes, and Zener diodes.

Advantages of the present invention may include one or more of the following. In one or more embodiments, .because a leakage current of a PLL loop filter capacitor may be controlled, a more stable and reliable operation of the PLL may be facilitated. Accordingly, the phase, shift of the PLL may not drift or may not drift as much as a PLL design without a diode.

In one or more embodiments, because a diode positioned in series with a PLL loop filter capacitor helps control a leakage current of the PLL loop filter capacitor, the chip area consumed by the PLL loop filter capacitor may be reduced because the PLL loop filter capacitor does not have to be as large to maintain the voltage potential on a control voltage signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a phase frequency detector arranged to detect a phase difference between a first clock signal and a second clock signal;

a charge pump arranged to output a control voltage signal dependent on the phase difference;

an on-chip capacitor operatively connected to the control voltage signal;

a diode operatively connected in series with the capacitor, wherein one terminal of the series-connected diode and capacitor is directly connected to the control voltage signal, and wherein another terminal of the series-connected diode and capacitor is connected to one of power and ground; and a voltage-controlled oscillator arranged to output the second clock signal dependent on the control voltage signal.

2. The integrated circuit of claim 1, wherein the capacitor is implemented with a transistor.

3. The integrated circuit of claim 1, wherein the diode is implemented with a transistor.

4. The integrated circuit of claim 1, wherein the diode is implemented with a p-n junction device.

5. The integrated circuit of claim 1, further comprising:

a bias generator arranged to output at least one bias signal dependent on the control voltage signal.

6. An integrated circuit, comprising:

means for detecting a phase difference between a first clock signal and a second clock signal;

means for generating a signal dependent on the phase difference;

means for storing charge on-chin to maintain a voltage potential on the signal;

a diode positioned in series with the means for storing and arranged to control a leakage current of the means for storing charge, wherein one terminal of the series-connected diode and means for storing is directly connected to the signal, and wherein another terminal of the series-connected diode and means for storing is connected to one of power and ground; and means for generating the second clock signal dependent on the signal.

7. The integrated circuit of claim 6, wherein the diode is implemented with a transistor.

8. The integrated circuit of claim 6, wherein the diode is implemented with a p-n junction device.

9. A method for performing a phase locked loop operation, comprising:

comparing a phase difference between a first clock signal and a second clock signal;

generating a control voltage signal dependent on the comparing;

storing charge dependent on the control voltage signal using an on-chip capacitor;

controlling a leakage current of the capacitor with a diode positioned in series with the capacitor, wherein one terminal of the series-connected diode and capacitor is directly connected to the control voltage signal, and wherein another terminal of the series-connected diode and capacitor is connected to one of power and ground; and generating the second clock signal dependent on the control voltage signal.

10. The method of claim 9, wherein the capacitor is a loop filter capacitor.

11. The method of claim 9, wherein the capacitor is implemented with a transistor.

12. The method of claim 9, wherein the diode is implemented with a transistor.

13. The method of claim 9, wherein the diode is implemented with a p-n junction device.

* * * * *

UNITED STATES PATENT AND TRADEMARK OFFICE
CERTIFICATE OF CORRECTION

PATENT NO. : 6,861,885 B2
DATED : March 1, 2005
INVENTOR(S) : Pradeep R. Trivedi et al.

It is certified that error appears in the above-identified patent and that said Letters Patent is hereby corrected as shown below:

Column 5,
Lines 3-4, please replace "an on-chip capacitor operatively connected to the control voltage signal;" with -- an on-chip loop filter capacitor operatively connected to the control voltage signal --.

Signed and Sealed this

Thirty-first Day of May, 2005

JON W. DUDAS
*Director of the United States Patent and Trademark Office*